(12) United States Patent
Wang et al.

(10) Patent No.: US 10,217,775 B2
(45) Date of Patent: Feb. 26, 2019

(54) DISPLAY SUBSTRATE, MANUFACTURING METHOD THEREOF, AND DISPLAY DEVICE

(71) Applicants: BOE Technology Group Co., Ltd., Beijing (CN); Beijing BOE Optoelectronics Technology Co., Ltd., Beijing (CN)

(72) Inventors: Shijun Wang, Beijing (CN); Wenbo Jiang, Beijing (CN); Zhenhua Lv, Beijing (CN); Zhiying Bao, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 14/787,627

(22) PCT Filed: Jun. 19, 2015

(86) PCT No.: PCT/CN2015/081927
§ 371 (c)(1),
(2) Date: Oct. 28, 2015

(87) PCT Pub. No.: WO2016/101558
PCT Pub. Date: Jun. 30, 2016

(65) Prior Publication Data
US 2016/0358948 A1 Dec. 8, 2016

(30) Foreign Application Priority Data
Dec. 23, 2014 (CN) .......................... 2014 1 0809526

(51) Int. Cl.
*H01L 27/12* (2006.01)
*H01L 29/786* (2006.01)
*G09G 5/00* (2006.01)

(52) U.S. Cl.
CPC ........ *H01L 27/1255* (2013.01); *H01L 27/124* (2013.01); *H01L 27/1262* (2013.01); *H01L 29/78633* (2013.01); *G09G 5/003* (2013.01)

(58) Field of Classification Search
CPC ... G09G 5/003; H01L 27/124; H01L 27/1255; H01L 27/1262; H01L 29/78633
See application file for complete search history.

(56) References Cited

U.S. PATENT DOCUMENTS

2002/0024048 A1* 2/2002 Ohtani ................ H01L 27/1237
257/66
2007/0146265 A1* 6/2007 Yamazaki ........... G02F 1/13454
345/87

(Continued)

FOREIGN PATENT DOCUMENTS

| CN | 103943634 A | 7/2014 |
| CN | 104576656 A | 4/2015 |

OTHER PUBLICATIONS

Aug. 26, 2015—International Search Report and Written Opinion Appn PCT/CN2015/081927 with English Tran.

(Continued)

*Primary Examiner* — Yosef Gebreyesus
(74) *Attorney, Agent, or Firm* — Banner & Witcoff, Ltd.

(57) ABSTRACT

A display substrate, a manufacturing method thereof, and a display device are disclosed. The display substrate includes a display region and a peripheral region, a display device including the display substrate further includes a gate driving circuit, the gate driving circuit includes a capacitor (C), the capacitor (C) includes a first electrode and a second electrode with an electrical insulation layer provided therebetween. The first electrode and the second electrode are remaining portions of films for forming conductive layers in the display region left in the peripheral region, and the (Continued)

electrical insulation layer is a remaining portion of a film for forming an insulation layer in the display region left in the peripheral region.

16 Claims, 4 Drawing Sheets

(56) References Cited

U.S. PATENT DOCUMENTS

| | | | |
|---|---|---|---|
| 2009/0231310 A1* | 9/2009 | Tsai | H01L 27/1288 345/205 |
| 2011/0053322 A1* | 3/2011 | Sasaki | H01L 29/7869 438/149 |
| 2011/0242470 A1* | 10/2011 | Moriwaki | G02F 1/136213 349/138 |
| 2012/0113343 A1* | 5/2012 | Konno | G02F 1/134363 349/39 |
| 2012/0161820 A1* | 6/2012 | Koo | G09G 3/3611 327/109 |
| 2014/0078034 A1 | 3/2014 | Son et al. | |
| 2014/0175445 A1* | 6/2014 | Cai | G02F 1/136213 257/70 |
| 2015/0287748 A1* | 10/2015 | Jin | H01L 27/124 257/306 |

OTHER PUBLICATIONS

Oct. 17, 2017—(CN) Office Action application CN 201410809526.4 with English Translation.
Feb. 4, 2017—(CN) First Office Action Appn 201410809526.4 with English Tran.

* cited by examiner

DISPLAY SUBSTRATE, MANUFACTURING METHOD THEREOF, AND DISPLAY DEVICE

The application is a U.S. National Phase Entry of International Application No. PCT/CN2015/081927 filed on Jun. 19, 2015, designating the United States of America and claiming priority to Chinese Patent Application No. 201410809526.4 filed on Dec. 23, 2014. The present application claims priority to and the benefit of the above-identified applications and the above-identified applications are incorporated by reference herein in their entirety.

TECHNICAL FIELD

At least one embodiment of the present invention relates to a display substrate, a manufacturing method thereof, and a display device.

BACKGROUND

For example, a display device may include an array substrate and a counter substrate (e.g. a color filter substrate), on the array substrate, gate lines and data lines arranged in a crisscross pattern are provided, and pixel units are surrounded by the gate lines and data lines, within the pixel units thin film transistors and pixel electrodes are provided. And gates of the transistors are electrically connected with the gate lines, and source electrodes are electrically connected with the data lines, and drain electrodes are electrically connected with the pixel electrodes.

In order to achieve normal display of the display device, it is necessary for the display device to include a gate driving circuit and a source driving circuit. Output terminals of the gate driving circuit are electrically connected with the gate lines for outputting gate driving signals to the gate lines, so as to turn on the transistors controlled by the gate lines to transmit data signals outputted by the source driving circuit to the pixel electrodes.

SUMMARY

The embodiments of the present invention provide a display substrate, a manufacturing method thereof, and a display device to simplify the manufacturing process of the gate driving circuit and reduce the manufacturing cost of the gate driving circuit.

At least one embodiment of the present invention provides a display substrate, the display substrate includes a display region and a peripheral region, a display device including the display substrate further includes a gate driving circuit configured for providing driving signals for gate driving lines in the display region, the gate driving circuit includes a capacitor which includes a first electrode and a second electrode with an electrical insulation layer is provided therebetween; an insulation layer and conductive layers are provided in the display region, the first electrode and the second electrode are remaining portions of films for forming the conductive layers left in the peripheral region, and the electrical insulation layer is a remaining portion of a films for forming the insulation layer left in the peripheral region.

At least one embodiment of the present invention further provides a display device including the above described display substrate.

At least one embodiment of the present invention further provides a method for manufacturing the display substrate, the method for manufacturing the display substrate includes: forming an insulation layer and conductive layers in a display region; and forming a capacitor in a peripheral region, wherein the capacitor includes a first electrode and a second electrode with an electrical insulation layer therebetween, wherein the first electrode and the second electrode are remaining portions of films for forming the conductive layers left in the peripheral region, and the electrical insulation layer is a remaining portion of a films for forming the insulation layer left in the peripheral. In the manufacturing method, the display device including the display substrate further includes a gate driving circuit configured for providing driving signals to gate lines of the display region, and the gate driving circuit includes the capacitor.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

Figure 1A:
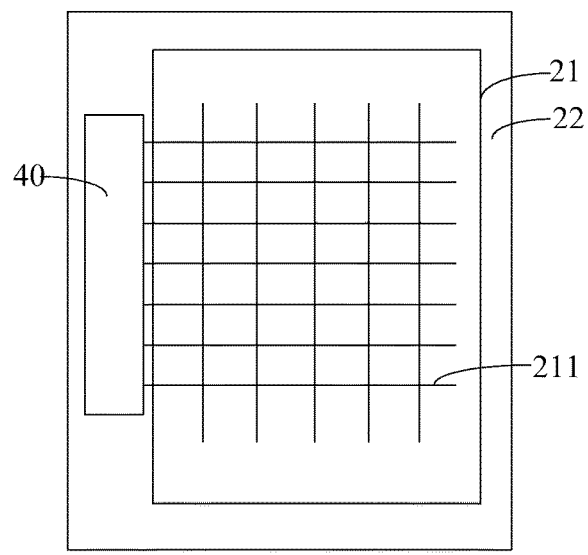
FIG. 1a is a schematic top view of a display substrate provided by an embodiment of the present invention.

Description of Reference Numerals:

| | |
|---|---|
| 1. Gate metal layer remaining portion; | 2. Gate insulation layer remaining portion; |
| 3. Source/drain metal layer remaining portion; | 4. Buffer layer remaining portion; |
| 5. Resin layer remaining portion; | 6. Common electrode layer remaining portion; |
| 7. Passivation layer remaining portion | 8. Pixel electrode layer remaining portion |
| 9. First via hole | 10. Second via hole |
| 11. Third via hole | 12. Fourth via hole |
| 13. Fifth via hole | 14. Sixth via hole |

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

During study, the inventors of the present application found that electrical components (e.g. capacitor) included in a gate driving circuit are located on a circuit board, and electrical connection between output terminals and gate lines is achieved by bonding wires, it causes a complex manufacturing process for the gate driving circuit, high manufacturing cost and in turn, high cost of the display device.

First Embodiment

An embodiment of the present invention provides a display substrate capable of simplifying the process for manufacturing a gate driving circuit and reducing the manufacturing cost of the gate driving circuit.

Figure 1B:
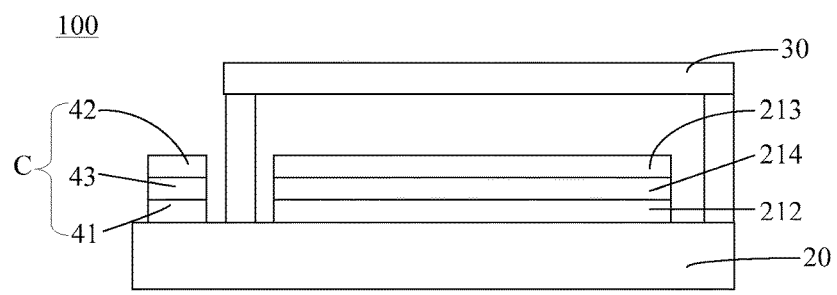
FIG. 1b is a schematic cross sectional view showing the structure of a display device provided by an embodiment of the present invention.

For example, as shown in FIG. 1a and FIG. 1b (FIGS. 1a and 1b are only used for exemplarily illustrating and do not reflect the true shape and scale), the display substrate includes a display region 21 and a peripheral region 22, a display device 100 including the display substrate further includes a gate driving circuit 40 configured for providing driving signals to gate driving lines 211 in the display region. The gate driving circuit 40 includes a capacitor C which includes a first electrode 41 and a second electrode 42 with an electrical insulation layer 43 provided therebetween. The display region 21 is provided with an insulation layer 214 and a plurality of conductive layers (e.g. conductive layers 212 and 213) therein, and the first electrode 41 and the second electrode 42 are remaining portions of a film for forming the conductive layers (e.g. conductive layer 212 and conductive layer 213), left in the peripheral region, and the electrical insulation layer 43 is a remaining portion of a film for forming the insulation layer 214, left in the peripheral region. By this method, the manufacturing process of the gate driving circuit can be simplified, the manufacturing cost for the gate driving circuit can be lowered down, and thus the manufacturing process for the display device can be simplified and the manufacturing cost of the display device can be lowered down.

The display substrate as above described may be an array substrate 20 or a color filter substrate 30. For example, when the capacitor C is formed on the color filter substrate, the capacitor C can be electrically communicated with the gate driving circuit on the array substrate through a conductive spacer or a conductive wire. Because there are a plurality of conductive layers and insulation layers on the array substrate, which facilitates to form the capacity, it is preferred that in an embodiment of the present invention, the display substrate is the array substrate.

Figure 1C:
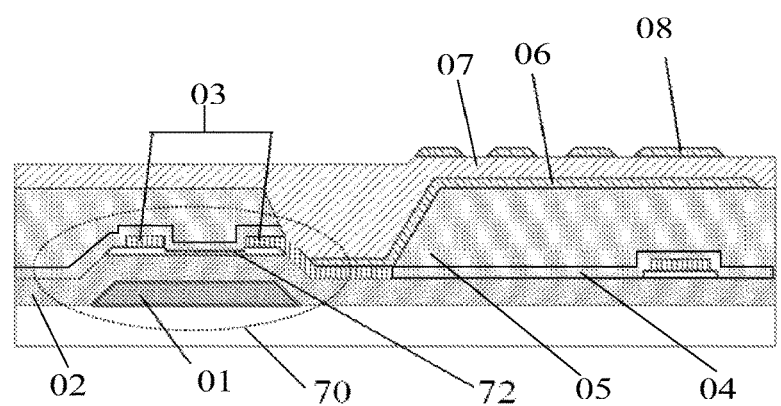
FIG. 1c is a schematic view showing the structure of film layers in a display region of a display substrate provided by an embodiment of the present invention.

For example, when the display substrate is the array substrate, as shown in FIG. 1c, a first metal layer 01, a gate insulation layer 02, a second metal layer 03, a buffer layer 04, a resin layer 05, a first electrode layer 06, a passivation layer 07 and a second electrode layer 08 can be sequentially provided in the display region. At this time, a remaining portion of a film for forming the first metal layer left in the peripheral region is a first metal layer remaining portion, a remaining portion of a film for forming the gate insulation layer left in the peripheral region is a gate insulation layer remaining portion, a remaining portion of a film for forming the second metal layer left in the peripheral region comprises a second metal layer remaining portion, a remaining portion of a film for forming the buffer layer left in the peripheral region comprises a buffer layer remaining portion, a remaining portion of a film for forming the resin layer left in the peripheral region comprises a resin layer remaining portion, a remaining portion of a film for forming the first electrode layer left in the peripheral region comprises a first electrode layer remaining portion, a remaining portion of a film for forming the passivation layer left in the peripheral region comprises a passivation layer remaining portion, and a remaining portion of a film for forming the second electrode layer left in the peripheral region comprises a second electrode layer remaining portion.

For example, when an array of thin film transistors 70 in the array substrate employs a bottom gate type structure, the first metal layer can be a gate metal layer, and the second metal layer can be a source/drain metal layer. Accordingly, the first metal layer remaining portion can be the gate metal layer remaining portion, and the second metal layer remaining portion can be the source/drain metal layer remaining portion. Alternatively, for example, when the array of the thin film transistors 70 in the array substrate employs a top gate type structure, the first metal layer can be the source/drain metal layer, and the second metal layer can be the gate metal layer. Accordingly, the first metal layer remaining portion can be the source/drain metal layer remaining portion, and the second metal layer remaining portion can be the gate metal layer remaining portion.

For example, the first electrode layer can be the common electrode layer, and the second electrode layer can be the pixel electrode layer, accordingly, the first electrode layer remaining portion can be the common electrode layer remaining portion and the second electrode layer remaining portion can be the pixel electrode layer remaining portion. Alternatively, for example, the first electrode layer can be the pixel electrode layer and the second electrode layer can be the common electrode layer, accordingly, the first electrode layer remaining portion can be the pixel electrode layer remaining portion and the second electrode layer remaining portion can be the common electrode layer remaining portion.

Of course, only some of the films of the first metal layer, the gate insulation layer, the second metal layer, the buffer layer, the resin layer, the first electrode layer, the passivation layer and the second electrode layer are provided in the display region, and accordingly, the remaining portions of these films can be formed in the peripheral region. For example, the first metal layer, the gate insulation layer, the second electrode metal layer, the buffer layer, the first electrode layer, the passivation layer and the second electrode layer may be sequentially provided in the display region. For example, the first metal layer, the gate insulation layer, the second electrode metal layer, the passivation layer and the pixel electrode layer may be sequentially provided in the display region.

In the present embodiment of the present invention and the attached drawings, an example in which the first metal layer is the gate metal layer, the second metal layer is the source/drain metal layer, the first electrode layer is the common electrode layer and the second electrode layer is the pixel electrode layer is illustrated.

Furthermore, for example, the gate metal layer remaining portion and the source/drain metal layer remaining portion are light shielding conductive layers, and the common electrode layer remaining portion and the pixel electrode layer remaining portion are transparent conductive layers, thus, the first electrode and/or the second electrode in the present embodiment of the present invention may include the transparent conductive layers and the light shielding conductive layers, and may also include only the light shielding conductive layers.

When the first electrode and/or the second electrode only include(s) light shielding conductive layers, for example, the two electrodes of the capacitor C are respectively the gate metal layer remaining portion and the source/drain metal layer remaining portion, it may easily cause UV curable adhesive coated on a region where the gate driving circuit is located to be incompletely cured, and may cause problems such as liquid crystal contamination, and so on. Therefore, in order to ensure the region where the gate driving circuit is located having a certain UV transmittance, it is necessary to perform drilling treatment on the gate metal layer remaining portion and the source/drain metal remaining portion, it causes that the area occupied by the capacitor C is relative large, the region where the gate driving circuit is located has a relative large area, and does not facilitate to reduce the area of the peripheral region and achieve narrow bezel.

Therefore, in at least one embodiment of the present invention, the first electrode and/or the second electrode may include the transparent conductive layer and the light shielding conductive layer. For example, the transparent conductive layer and the light shielding conductive layer included in the first electrode or the second electrode may be electrically connected through via holes, thus it is possible to reduce the area occupied by the light shielding conductive layer in the electrodes of the capacitor C, thus it is unnecessary to perform the drilling treatment on the electrodes, by doing so, it is possible to reduce the area occupied by the capacitor C, reduce the area of the region where the gate driving circuit is located, facilitate to reduce the area of the peripheral region and achieve narrow bezel, and hence facilitate to achieve high resolution.

It is to be noted that, the above expression "the first electrode and/or the second electrode include the transparent conductive layers and the light shielding conductive layers" includes two situations: one is that the first electrode includes the transparent conductive layers and the light shielding conductive layers; alternatively, the second electrode includes the transparent conductive layers and the light shielding conductive layers; and the other situation is that both the first electrode and the second electrode include the transparent conductive layers and the light shielding conductive layers.

Exemplarily, when the first electrode includes the transparent conductive layers and the light shielding conductive layers, as shown in FIG. 1c, the gate metal layer remaining portion 1, the gate insulation layer remaining portion 2, the source/drain metal layer remaining portion 3, the buffer layer remaining portion 4 and the common electrode remaining portion 6 are sequentially provided in the region where the capacitor is located, a first via hole 9 penetrating through the buffer layer remaining portion 4 and the gate insulation layer remaining portion 2 is further provided in the region where the capacitor is located, and the common electrode layer remaining portion 6 is electrically connected with the gate metal layer remaining portion 3 through the first via hole 9. There is an overlapped region between the source/drain metal layer remaining portion 3 and the gate metal layer remaining portion 1, and there is an overlapped region between the source/drain metal layer remaining portion 3 and the common electrode layer remaining layer 6. The first electrode includes the gate metal layer remaining portion 1 and the common electrode layer remaining portion 6, and the second electrode is the source/drain metal layer remaining portion 3. At this time, the capacitor C is equivalent to a shunt capacitor consisted of a capacitor C1 formed by the gate metal layer remaining portion 1, the gate insulation layer remaining portion 2 and the source/drain metal layer remaining portion 3 and a capacitor C2 formed by the source/drain metal layer remaining portion 3, the buffer layer remaining portion 4 and the common electrode layer remaining portion 6, and has capacitance known from the calculation formula of the shunt capacitor: $C=C1+C2$, and thus the magnitude of the capacitor C can be ensured while the area occupied by the capacitor is reduced, without influencing the driving capacity of the gate driving circuit.

Figure 2:
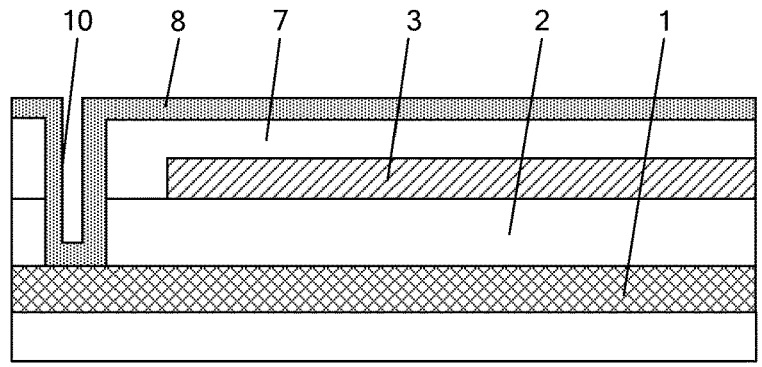
FIG. 2 is a second schematic cross sectional view showing a region where a capacitor is located according to an embodiment of the present invention.

Exemplarily, when the second electrode includes the transparent conductive layers and the light shielding conductive layers, as shown in FIG. 2, the region where the capacitor C is located includes the gate metal layer remaining portion 1, the gate insulation layer remaining portion 2, the source/drain metal layer remaining layer 3, the passivation layer remaining portion 7 and the pixel electrode layer remaining portion 8, which are sequentially provided. The region where the capacitor C is located further includes a second via hole 10 penetrating through the passivation layer remaining portion 7 and the gate insulation layer remaining portion 2, and the pixel electrode layer remaining portion 8 is electrically connected with the gate metal layer remaining portion 1 through the second via hole 10. There is an overlapped region between the source/drain metal layer remaining portion 3 and the gate metal layer remaining portion 1, and there is an overlapped region between the source/drain metal layer remaining portion 3 and the pixel electrode remaining portion 8. The first electrode is the source/drain metal layer remaining portion 3, and the second electrode includes the gate metal layer remaining portion 1 and the pixel electrode layer remaining portion 8. At this time, the capacitor C is equivalent to a shunt capacitor consisted of a capacitor C3 formed by the gate metal layer remaining portion 1, the gate insulation layer remaining portion 2 and the source/drain metal layer remaining portion 3 and a capacitor C4 formed by the source/drain metal layer remaining portion 3, the passivation layer remaining portion 7 and the pixel electrode layer remaining portion 8, then according to the shunt capacitor calculation formula, has capacitance of $C=C3+C4$, and thus the magnitude of the capacitor C can be ensured while the area occupied by the capacitor C is reduced, without influencing the driving capacity of the gate driving circuit.

When both the first electrode and the second electrode include the transparent conductive layers and the light shielding conductive layers, the embodiments of the present invention provide the following two specific structure of the display substrate.

Figure 3:
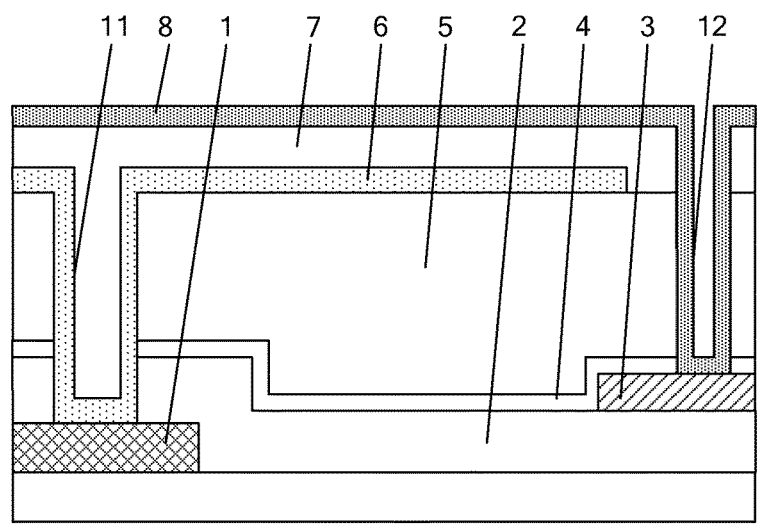
FIG. 3 is a third schematic cross sectional view showing a region where a capacitor is located according to an embodiment of the present invention.
Figure 4:
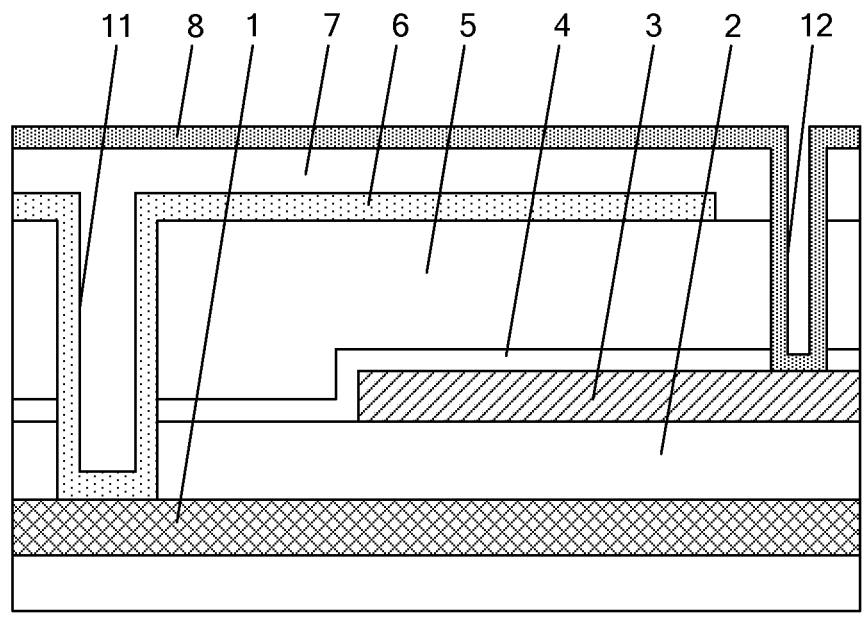
FIG. 4 is a fourth schematic cross sectional view showing a region where a capacitor is located according to an embodiment of the present invention.

In the first structure, as shown in FIG. 3 and FIG. 4, the gate metal layer remaining portion 1, the gate insulation layer remaining portion 2, the source/drain metal layer remaining portion 3, the resin layer remaining portion 5, the common electrode layer remaining portion 6, the passivation layer remaining portion 7 and the pixel electrode remaining portion 8 are sequentially provided in the region where the capacitor is located. A third via hole 11 penetrating through the resin layer remaining portion 5 and the gate insulation remaining portion 2 and a fourth via hole 12 penetrating through the passivation layer remaining portion 7 and the resin layer remaining portion 5 are further provided in the region where the capacitor is located, and the common electrode layer remaining portion 6 is electrically connected with the gate metal layer remaining portion 1 through the third via hole 11, and the pixel electrode layer remaining portion 8 is electrically connected with the source/drain metal layer remaining portion 3 through the fourth via hole 12. The first electrode includes the gate metal layer remaining portion 1 and the common electrode layer remaining portion 6, and the second electrode includes the source/drain metal layer remaining portion 3 and the pixel electrode layer remaining portion 8. There is or is not an overlapped region between the gate metal layer remaining portion 1 and the source/drain metal layer remaining portion 3.

Furthermore, as shown in FIG. 3, when there is not any overlapped region between the gate metal layer remaining portion 1 and the source/drain metal layer remaining portion 3, the capacitor C is a capacitor formed by the common electrode layer remaining portion 6, the passivation layer remaining portion 7 and the pixel electrode layer remaining portion 8.

In the embodiments of the present invention, the thickness of the passivation layer remaining portion 5 is 500 Å-3000 Å, generally, dielectric of the capacitor C1 in the gate driving circuit (e.g. GOA circuit) is the gate insulation layer remaining portion, and the gate insulation remaining portion generally has a thickness of 4000 Å. It is known from the capacitance calculation formula $C=\varepsilon*S/d$ (where $\varepsilon$ is dielectric constant of the dielectric, S is opposing area of the two electrodes, and d is vertical distance between the two electrodes), as d is reduced, S is also reduced, while the capacitance is remained constant, thus, by changing the electrical insulation layer between the capacitor from the relative thick gate insulation layer remaining portion to the relative thin passivation remaining portion, area of the common electrode layer remaining portion 6 and the pixel electrode remaining portion 8 can be further reduced, thus the area occupied by the capacitor C can be further reduced, area of the region where the gate driving circuit is located can be reduced, area of the peripheral region of the display substrate can be reduced, and narrow bezel design of the display device can be facilitated, therefore, the display substrate shown in FIG. 3 is preferred in the embodiments of the present invention. Exemplarily, the thickness of the passivation layer remaining portion 7 is 1500 Å.

As shown in FIG. 4, when there is an overlapped region between the gate metal layer remaining portion 1 and the source/drain metal layer remaining portion 3, the capacitor C is equivalent to a shunt capacitor consisted of a capacitor C5 formed by the gate metal layer remaining portion 1, the gate insulation layer remaining portion 2 and the source/drain metal layer remaining portion 3 and a capacitor C6 formed by the common electrode layer remaining portion 6, the passivation layer remaining portion 7 and the pixel electrode layer remaining portion 8, then according to calculation formula of a shunt capacitance, C=C5+C6, thus the magnitude of the capacitor C is ensured while the area occupied by the capacitor C is reduced, without influencing the driving capacity of the gate driving circuit.

It is to be noted that the display substrate shown in FIG. 3 and FIG. 4 may also include the buffer layer remaining portion 4 between the source/drain metal layer remaining portion 3 and the resin layer remaining portion 5 to improve the adhesion of the resin layer remaining portion 5 on the display substrate.

Figure 5:
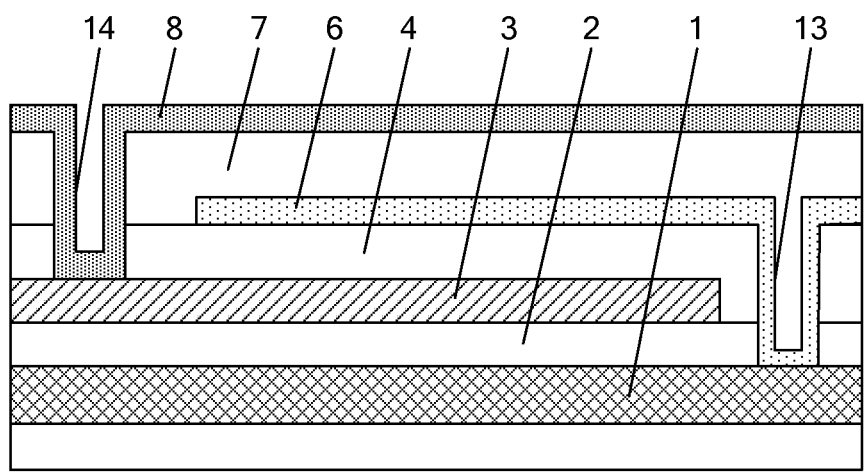
FIG. 5 is a fifth schematic cross sectional view showing a region where a capacitor is located according to an embodiment of the present invention.

In the second structure, as shown in FIG. 5, the gate metal layer remaining portion 1, the gate insulation layer remaining portion 2, the source/drain metal layer remaining portion 3, the buffer layer remaining portion 4, the common electrode layer remaining portion 6, the passivation layer remaining portion 7 and the pixel electrode layer remaining portion 8 are sequentially provided in the region where the capacitor C is located. A fifth via hole 13 penetrating through the buffer layer remaining portion 4 and the gate insulation layer remaining portion 2, and a sixth via hole 14 penetrating through the passivation layer remaining portion 7 and the buffer layer remaining portion 4 is further provided in the region where the capacitor C is located, wherein the common electrode layer remaining portion 6 is electrically connected with the gate metal layer remaining portion 1 through the fifth via hole 13, and the pixel electrode layer remaining portion 8 is electrically connected with the source/drain metal layer remaining portion 3 through the sixth via hole 14. There is an overlapped region between the gate metal layer remaining portion, the source/drain metal layer remaining portion, the common electrode layer remaining portion and the pixel electrode layer remaining portion. The first electrode includes the gate metal layer remaining portion 1 and the common electrode layer remaining portion 6, and the second electrode includes the source/drain metal layer remaining portion 3 and the pixel electrode layer remaining portion 8. At this time, the capacitor C is equivalent to a shunt capacitor consisted of a capacitor C7 formed by the gate metal layer remaining portion 1, the gate insulation layer remaining portion 2 and the source/drain metal layer remaining portion 3, a capacitor C8 formed by the source/drain metal layer remaining portion 3, the buffer layer remaining portion 4 and the common electrode layer remaining portion 6, and a capacitor C9 formed by the common electrode layer remaining portion 6, the passivation layer remaining portion 7 and the pixel electrode layer remaining portion 8, then according to calculation formula of a shunt capacitor, C=C7+C8+C9, thus the magnitude of the capacitor can be ensured while reducing the area occupied by the capacitor, without influencing the driving capacity of the gate driving circuit.

It is to be noted that material for the above described common electrode layer remaining portion 6 and the pixel electrode layer remaining portion 8 can be transparent conductive material, for example, Indium Tin Oxide.

Sealant is provided above the capacitor C of the gate driving circuit, and the sealant needs to be cured by illuminating e.g. Ultraviolet rays or infrared rays to seal the box, sealant curing can be well achieved by using transparent material in the layers of the capacitor C.

In the specific structure of the region where the capacitor is located, as above described, the gate metal layer remaining portion 1 may have a thickness of 3400 Å, the gate insulation layer remaining portion 2 may have a thickness of 4000 Å, the source/drain metal layer remaining portion 3 may have a thickness of 2200 Å, the buffer layer remaining portion 4 may have a thickness of 1000 Å, the resin layer remaining portion 5 may have a thickness of 10000 Å, the common electrode layer remaining portion 6 may have a thickness of 400 Å, the passivation layer remaining portion 7 may have a thickness of 1500 Å, and the pixel electrode layer remaining portion 8 may have a thickness of 400 Å. It is to be noted that the thickness of each layer of the above remaining portions can be set by the person skilled in the art according to the particular situation.

It is to be noted that when the gate driving circuit on the display substrate includes a plurality of capacitors, all the capacitors can have the above described structure, or only a part of the capacitors may have the above described structure, for example, only the capacitor occupying the largest area may have the above described structure, it can be selected as desired by the person skilled in the art, and there is no limitation in the embodiments of the present invention.

In addition, it is to be further noted that the structure of the capacitor in the embodiments of the present invention is not limited to the above described structures, as long as it is a structure in which the first electrode and the second electrode are the remaining portions of the films for forming the conductive layers left in the peripheral region and the electrical insulation layer is the remaining portion of the film for forming the insulation layer left in the peripheral region, and it would not be further described in the embodiments of the present invention.

In addition, the display substrate may further include an active layer 72, and so on, and it will not be further described in the embodiments of the present invention.

The embodiments of the present invention provide a display substrate, as shown in FIG. 1a and FIG. 1b, the display substrate includes a display region 21 and a peripheral region 22, a display device 100 including the display substrate further includes a gate driving circuit 40 configured for providing driving signals to gate driving lines 211 of the display region 21. The gate driving circuit 40 includes a capacitor C, the capacitor C includes a first electrode 41 and a second electrode 42 with an electrical insulation layer 43 provided therebetween. The first electrode 41 and the second electrode 42 are the remaining portions of a film for forming the conductive layers 212, 213 left in the peripheral region 22, and the electrical insulation layer 43 is the remaining portion of a film for forming the insulation layer 214 left in the peripheral region 22, thus, the manufacturing process of the gate driving circuit 40 can be simplified, the manufacturing cost of the gate driving circuit 40 is lowered down, and thus the manufacturing process of the display device can be simplified and the manufacturing cost of the display device can be lowered down.

In addition, the embodiments of the present invention further provide a display device, as shown in FIG. 1b, the display device includes any one of the display substrates as above described. For example, the display substrate may be an array substrate 20 or a color filter substrate 30. FIG. 1b is illustrated by way of the example of the display substrate being an array substrate 20. The display device may be a liquid crystal panel, an electronic paper, an organic light emitting display panel, a mobile phone, a tablet computer, a television, a display, a laptop computer, a digital photo frame, a navigator, or any product or component having display function.

Second Embodiment

The embodiments of the present invention provide a method for manufacturing a display substrate, the method includes forming an insulation layer and a plurality of conductive layers in a display region; and forming a capacitor in a peripheral region so that the capacitor includes a first electrode and a second electrode with an electrical insulation layer provided therebetween, wherein the first electrode and the second electrode are remaining portions of a film for forming the conductive layers left in the peripheral region, and the electrical insulation layer is a remaining portion of a film for forming the insulation layer left in the peripheral region. In this manufacturing method, the display device including the display substrate may further include a gate driving circuit configured for providing driving signals to gate driving lines in the display region, and the gate driving circuit includes the capacitor.

Figure 6:
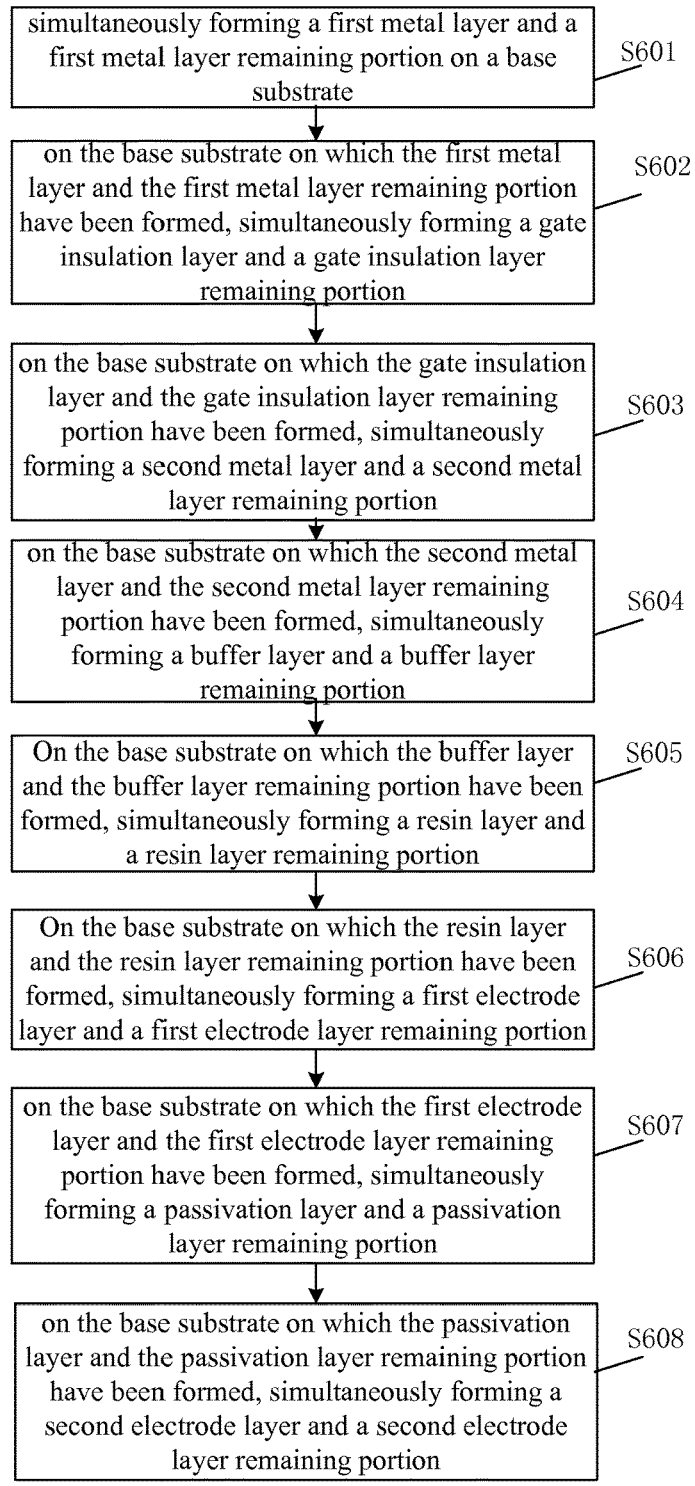
FIG. 6 is a manufacturing flowchart view for a display substrate in an embodiment of the present invention.

For example, as shown in FIG. 6, the method for manufacturing the display substrate may include the following step S601 to the step S608, these steps will be described in detail below.

Step S601, simultaneously forming a first metal layer and a first metal layer remaining portion on a base substrate.

Step S602, on the base substrate on which the first metal layer and the first metal layer remaining portion have been formed, forming a gate insulation layer and a gate insulation layer remaining portion.

The step S603, on the base substrate on which the gate insulation layer and the gate insulation layer remaining portion have been formed, forming a second metal layer and a second metal layer remaining portion.

The step S604, on the base substrate on which the second metal layer and the second metal layer remaining portion have been formed, forming a buffer layer and a buffer layer remaining portion.

The step S605, on the base substrate on which the buffer layer and the buffer layer remaining portion have been formed, forming a resin layer and a resin layer remaining portion.

The step S606, on the base substrate on which the resin layer and the resin layer remaining portion have been formed, forming a first electrode layer and a first electrode layer remaining portion.

The step S607, on the base substrate on which the first electrode layer and the first electrode layer remaining portion have been formed, forming a passivation layer and a passivation layer remaining portion.

The step S608, on the base substrate on which the passivation layer and the passivation layer remaining portion have been formed, forming a second electrode layer and a second electrode layer remaining portion.

In these above steps, the first metal layer, the gate insulation layer, the second metal layer, the buffer layer, the resin layer, the first electrode layer, the passivation layer and the second electrode layer are located in a display region of the display substrate, the first metal layer remaining portion 1, the gate insulation layer remaining portion 2, the second metal layer remaining portion 3, the buffer layer remaining portion 4, the resin layer remaining portion 5, the first electrode remaining portion 6, the passivation remaining portion 7 and the second electrode layer remaining portion 8 are located in a peripheral region of the display substrate.

For example, when an array of thin film transistors in the array substrate employs a bottom gate structure, the first metal layer may be a gate metal layer, and the second metal layer may be a source/drain metal layer; accordingly, the first metal layer remaining portion may be a gate metal layer remaining portion, and the second metal layer remaining portion may be a source/drain metal layer remaining portion. Alternatively, for example, when an array of thin film transistors 70 in the array substrate employs top gate structure, the first metal layer may be a source/drain metal layer, and the second metal layer may be a gate metal layer; accordingly, the first metal layer remaining portion may be a source/drain metal layer remaining portion and the second metal layer remaining portion may be a gate metal layer remaining portion.

For example, the first electrode layer may be a common electrode layer, and the second electrode layer may be a pixel electrode layer; accordingly, the first electrode remaining portion is a common electrode layer remaining portion and the second electrode layer remaining portion is a pixel electrode layer remaining portion. Alternatively, for example, the first electrode layer may be a pixel electrode layer and the second electrode layer may be a common electrode layer, accordingly, the first electrode layer remaining portion is a pixel electrode layer remaining portion, the second electrode layer remaining portion is a common electrode layer remaining portion.

Of course, in the display region, only a part of these films of the first metal layer, the gate insulation layer, the second metal layer, the buffer layer, the resin layer, the first electrode layer, the passivation layer and the second electrode layer may be provided; accordingly, the remaining part of these films may be formed in the peripheral region. For example, the display region may be sequentially provided with the first metal layer, the gate insulation layer, the second metal layer, the buffer layer, the first electrode layer, the passivation layer and the second electrode layer. For example, the display region may be sequentially provided with the first metal layer, the gate insulation layer, the second metal layer, the passivation layer and the pixel electrode layer.

The embodiments of the present invention and the attached drawings will be described by way of the example in which the first metal layer is a gate metal layer, the second metal layer is a source/drain metal layer, the first electrode layer is a common electrode layer, the second electrode layer is a pixel electrode layer, and the base substrate is sequentially provided with the gate metal layer, the gate insulation layer, the source/drain metal layer, the buffer layer, the resin layer, the common electrode layer, the passivation layer and the pixel electrode layer.

At this time, a first electrode and a second electrode of the capacitor C in the gate driving circuit respectively include at least one of the gate metal layer remaining portion 1, the source/drain metal layer remaining portion 3, the common electrode layer remaining portion 6 and the pixel electrode layer remaining portion 8; the electrical insulation layer located between the first electrode and the second electrode includes at least one of the gate insulation remaining portion 2, the buffer layer remaining portion 4, the resin layer remaining portion 5 and the passivation layer remaining portion 7.

Based on the embodiments of the present invention, the specific implementation manners for the steps can be easily obtained without creative labor by the person skilled in the art, in addition, the method for manufacturing the display substrate may further includes the step of forming an active layer 72, and so on, and will not be further described in detail.

Figure 1D:
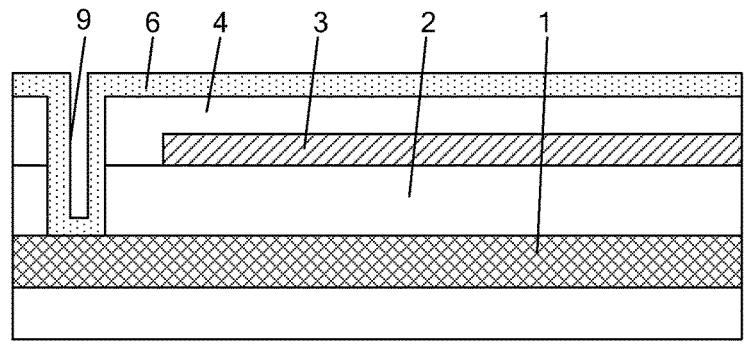
FIG. 1d is a first schematic cross sectional view showing a region where a capacitor is located according to an embodiment of the present invention.

For example, when making the display substrate as shown in FIG. 1d, the step S605 of forming the resin layer remaining portion 5 may include forming a layer of resin material on the base substrate on which the buffer layer and the buffer layer remaining portion 4 have been formed, and after patterning process, forming the resin layer remaining portion 5 in the peripheral region other than the region where the capacitor C is located. The method for manufacturing the display substrate further includes forming a first via hole 9 penetrating through the buffer layer remaining portion 4 and the gate insulation layer remaining portion 2 so that the common electrode layer remaining portion 6 is electrically connected with the gate metal layer remaining portion 1 through the first via hole 9. There is an overlapped region between the so formed source/drain metal layer remaining portion 3 and the gate metal layer remaining portion 1, and there is an overlapped region between the source/drain metal layer remaining portion 3 and the common electrode layer remaining portion 6. The first electrode includes the gate metal layer remaining portion and the common electrode layer remaining portion, and the second electrode includes the source/drain metal layer remaining portion. At this time, the capacitor C is equivalent to a shunt capacitor consisted of a capacitor C1 formed by the gate metal layer remaining portion 1, the gate insulation layer remaining portion 2 and the source/drain metal layer remaining portion 3, and a capacitor C2 formed by the source/drain metal layer remaining portion 3, the buffer layer remaining portion 4 and the common electrode layer remaining portion 6.

When making the display substrate as shown in FIG. 2, prior to forming the passivation layer remaining portion 7, it is necessary to remove the common electrode layer remaining portion 6, the resin layer remaining portion 5 and the buffer layer remaining portion 4 in the region where the capacitor C is located. Exemplarily, a layer of remaining portion photoresist may be coated on the common electrode remaining portion 6 after forming the common electrode remaining portion 6, then by being covered by a mask plate having a pattern and by the processes such as exposure, development, etching, peeling off the photoresist, and so on, the common electrode layer remaining portion 6, the resin layer remaining portion 5 and the buffer layer remaining portion 4 in the region where the capacitor C is located are removed. The method for manufacturing the display substrate further includes forming a second via hole 10 penetrating through the passivation layer remaining portion 7 and the gate insulation layer remaining portion 2 with the pixel electrode layer remaining portion 8 being electrically connected with the gate metal layer remaining portion 1 through the second via hole 10. There is an overlapped region between the so formed source/drain metal layer remaining portion 3 and the gate metal layer remaining portion 1, and there is an overlapped region between the source/drain metal layer remaining portion 3 and the pixel electrode layer remaining portion 8. The first electrode includes the source/drain metal layer remaining portion 3, and the second electrode includes the gate metal layer remaining portion 1 and the pixel electrode layer remaining portion 8. At this time, the capacitor C is equivalent to a shunt capacitor consisted of a capacitor C3 formed by the gate metal layer remaining portion 1, the gate insulation layer remaining portion 2 and the source/drain metal layer remaining portion 3 and a capacitor C4 formed by the source/drain metal layer remaining portion 3, the passivation layer remaining portion 7 and the pixel electrode layer remaining portion 8.

When making the display substrate as shown in FIG. 3 and FIG. 4, the method for manufacturing the display substrate further includes forming a third via hole 11 penetrating through the resin layer remaining portion 5 and the gate insulation layer remaining portion 2 with the common electrode layer remaining portion 6 being electrically connected with the gate metal layer remaining portion 1 thought the third via hole 11; and forming a fourth via hole 12 penetrating the passivation layer remaining portion 7 and the resin layer remaining portion 5 with the pixel electrode layer remaining portion 8 being electrically connected with the source/drain metal layer remaining portion 3 through the fourth via hole 12. The first electrode includes the gate metal layer remaining portion and the common electrode layer remaining portion, and the second electrode includes the source/drain metal layer remaining portion and the pixel electrode layer remaining portion. When there is no overlapped region between the so formed gate metal layer remaining portion 1 and the source/drain metal layer remaining portion 3, the so made display substrate is shown in FIG. 3, the capacitor C is a capacitor formed by the common electrode layer remaining portion 6, the passivation layer remaining portion 7 and the pixel electrode layer remaining portion 8. When there is an overlapped region between the so formed gate metal layer remaining portion 1 and the source/drain metal layer remaining portion 3, the so made display substrate is shown in FIG. 4, and the capacitor C is equivalent to a shunt capacitor consisted of a capacitor C5 formed by the gate metal layer remaining portion 1, the gate insulation layer remaining portion 2 and the source/drain metal layer remaining portion 3 and a capacitor C6 formed by the common electrode remaining portion 6, the passivation layer remaining portion 7 and the pixel electrode layer remaining portion 8.

When making a display substrate as shown in FIG. 5, the step S605 of forming the resin layer remaining portion 5 includes coating a layer of resin material on the base substrate on which the buffer layer and the buffer layer remaining portion 4 have been formed, and after patterning process, forming the resin layer remaining portion 5 in the peripheral region other than the region where the capacitor C is located. The method for manufacturing the display substrate may further include: forming a fifth via hole 13 penetrating the buffer layer remaining portion 4 and the gate insulation layer remaining portion 2 with the common electrode layer remaining portion 6 being electrically connected with the gate metal layer remaining portion 1 through the fifth via hole 13; and forming a sixth via hole 14 penetrating through the passivation layer remaining portion 7 and the buffer layer remaining portion 4 with the pixel electrode layer remaining portion 8 being electrically connected with the source/drain metal layer remaining portion 3 through the sixth via hole 14. Wherein there is an overlapped region between the so formed gate metal layer remaining portion, the source/drain metal layer remaining portion, the common electrode layer remaining portion and the pixel electrode layer remaining portion. The first electrode includes the gate metal layer remaining portion 1 and the common electrode layer remaining portion 6 and the second electrode includes the source/drain metal layer remaining portion 3 and the pixel electrode layer remaining portion 8. At this time, the capacitor C is equivalent to a shun capacitor consisted of a capacitor C7 formed by the gate metal layer remaining portion 1, the gate insulation layer remaining portion 2 and the source/drain metal layer remaining portion 3, a capacitor C8 formed by the source/drain metal layer remaining portion 3, the buffer layer remaining portion 4 and the common electrode layer remaining portion 6, and a capacitor C9 formed by the common electrode layer remaining portion 6, the passivation layer remaining portion 7 and the pixel electrode layer remaining portion 8.

It is to be noted that the above first via hole 9, the second via hole 10, the third via hole 11, the fourth via hole 12, the fifth via hole 13 and the sixth via hole 14 each penetrate through at least two layers of films, and during forming these via holes, all the via holes can be formed in one patterning process, or can be formed in multiple patterning processes and in each of the patterning processes, sub-via holes penetrating only one film are formed, and a plurality of sub-via holes are communicated with each other to form the via holes, but there is no limitation in the embodiments of the present invention.

The embodiments of the present invention provide a method for manufacturing a display substrate, as above described, with this method, a separate capacitor in the gate driving circuit included in the display device is unnecessary, thus it is possible to simplify the manufacturing process of the gate driving circuit, to reduce the manufacturing cost of the gate driving circuit, and therefore, the manufacturing process of the display device can be simplified and the manufacturing cost of the display device can be lowered down.

The present disclosure has been described above by way of the exemplary embodiment, and the protection scope of the present disclosure would not be limited therein, and is only defined by the following claims.

The present application claims the priority of Chinese Patent Application No. 201410809526.4 filed on Dec. 23, 2014, the Chinese Patent Application is entirely incorporated therein as a part of the present application by reference.

What is claimed is:

1. A display substrate comprising a display region and a peripheral region, wherein:
   the peripheral region is provided with a capacitor therein, the capacitor comprises a first electrode and a second electrode with an electrical insulation layer provided therebetween,
   the display region is provided with an insulation layer and conductive layers therein, the first electrode and the second electrode are remaining portions of films for forming the conductive layers left in the peripheral region, and the electrical insulation layer is a remaining portion of a film for forming the insulation layer left in the peripheral region,
   the first electrode comprises a first transparent conductive layer and a first light shielding conductive layer, and the second electrode comprises a second transparent conductive layer and a second light shielding conductive layer.

2. The display substrate according to claim 1, wherein the display substrate is an array substrate or a color filter substrate.

3. The display substrate according to claim 2, wherein the capacitor is provided on the array substrate.

4. The display substrate according to claim 2, wherein:
   in the display region, a first metal layer, a gate insulation layer, a second metal layer, a buffer layer, a resin layer, a first electrode layer, a passivation layer and a second electrode layer are sequentially provided, or in the display region, the first metal layer, the gate insulation layer, the second metal layer, the buffer layer, the first electrode layer, the passivation layer and the second electrode layer are sequentially provided;
   a remaining portion of a film for forming the first metal layer left in the peripheral region is a first metal layer remaining portion;
   a remaining portion of a film for forming the gate insulation layer left in the peripheral region is a gate insulation layer remaining portion;
   a remaining portion of a film for forming the second metal layer left in the peripheral region is a second metal layer remaining portion;
   a remaining portion of a film for forming the buffer layer left in the peripheral region is a buffer layer remaining portion;
   a remaining portion of a film for forming the resin layer left in the peripheral region is a resin layer remaining portion;
   a remaining portion of a film for forming the first electrode layer left in the peripheral region is a first electrode layer remaining portion;
   a remaining portion of a film for forming the passivation layer left in the peripheral region is a passivation layer remaining portion; and
   a remaining portion of a film for forming the second electrode layer left in the peripheral region is a second electrode layer remaining portion;
   wherein one of the first metal layer and the second metal layer is a gate metal layer, and the other one is a source/drain metal layer, and one of the first electrode layer and the second electrode layer is a pixel electrode layer, and the other one is a common electrode layer.

5. The display substrate according to claim 4, wherein:
the first transparent conductive layer is the first electrode layer remaining portion;
the second transparent conductive layer is the second electrode layer remaining portion;
the first light shielding conductive layer is the first metal layer remaining portion; and
the second light shielding conductive layer is the second metal layer remaining portion.

6. The display substrate according to claim 5, wherein:
the first transparent conductive layer is connected with the first light shielding conductive layer through a via hole; or
the second transparent conductive layer is connected with the second light shielding conductive layer through a via hole.

7. The display substrate according to claim 4, wherein the first metal layer remaining portion, the gate insulation layer remaining portion, the second metal layer remaining portion, the buffer layer remaining portion and the first electrode layer remaining portion are sequentially provided in a region where the capacitor is located, and the region where the capacitor is located is further provided with a first via hole which penetrates through both the buffer layer remaining portion and the gate insulation layer remaining portion, and the first electrode layer remaining portion is electrically connected with the first metal layer remaining portion through the first via hole;
there is an overlapped region between the second metal layer remaining portion and the first metal layer remaining portion, and there is an overlapped region between the second metal layer remaining portion and the first electrode layer remaining portion;
the first electrode comprises the first metal layer remaining portion and the first electrode layer remaining portion, and the second electrode comprises the second metal layer remaining portion.

8. The display substrate according to claim 4, wherein:
the first metal layer, the gate insulation layer, the second metal layer, the passivation layer and the pixel electrode layer are sequentially provided in the display region;
a remaining portion of a film for forming the first metal layer left in the peripheral region comprises a first metal layer remaining portion;
a remaining portion of a film for forming the gate insulation layer left in the peripheral region comprises a gate insulation layer remaining portion;
a remaining portion in the peripheral region a film for forming the second metal layer comprises a second metal layer remaining portion;
a remaining portion of a film for forming the passivation layer left in the peripheral region comprises a passivation layer remaining portion; and
a remaining portion of a film for forming the pixel electrode layer left in the peripheral region comprises a pixel electrode layer remaining portion;
wherein the first metal layer is the gate metal layer, and the second metal layer is the source/drain metal layer; or the first metal layer is the source/drain metal layer and the second metal layer is the gate metal layer.

9. The display substrate according to claim 8, wherein:
the first transparent conductive layer and the second transparent conductive layer comprise the pixel electrode layer remaining portion; and
the first light shielding conductive layer and the second light shielding conductive layer comprise the first metal layer remaining portion or the second metal layer remaining portion.

10. The display substrate according to claim 4, wherein the first metal layer remaining portion, the gate insulation layer remaining portion, the second metal layer remaining portion, the passivation layer remaining portion and the pixel electrode layer remaining portion are sequentially provided in a region where the capacitor is located, a second via hole penetrating through the passivation layer remaining portion and the gate insulation layer remaining portion is further provided in the region where the capacitor is located, the pixel electrode layer remaining portion is electrically connected with the first metal layer remaining portion through the second via hole;
there is an overlapped region between the second metal layer remaining portion and the first metal layer remaining portion, and there is an overlapped region between the second metal layer remaining portion and the pixel electrode layer remaining portion;
the first electrode comprises the second metal layer remaining portion, and the second electrode comprises the first metal layer remaining portion and the pixel electrode layer remaining portion.

11. The display substrate according to claim 4, wherein the first metal layer remaining portion, the gate insulation layer remaining portion, the second metal layer remaining portion, the resin layer remaining portion, the first electrode layer remaining portion, the passivation layer remaining portion and the second electrode layer remaining portion are sequentially provided in a region where the capacitor is located, a third via hole penetrating through the resin layer remaining portion and the gate insulation layer remaining portion and the region where the capacitor is located is further provided with a fourth via hole which penetrates through both the passivation layer remaining portion and the resin layer remaining portion, the first electrode layer remaining portion is electrically connected with the first metal layer remaining portion through the third via hole, and the second electrode layer remaining portion is electrically connected with the second metal layer remaining portion through the fourth via hole;
the first electrode comprises the first metal layer remaining portion and the first electrode layer remaining portion, and the second electrode comprises the second metal layer remaining portion and the second electrode layer remaining portion.

12. The display substrate according to claim 11, wherein there is no overlapped region between the first metal layer remaining portion and the second metal layer remaining portion.

13. The display substrate according to claim 11, wherein there is an overlapped region between the first metal layer remaining portion and the second metal layer remaining portion.

14. The display substrate according to claim 11, wherein the buffer layer remaining portion is provided between the second metal layer remaining portion and the resin layer remaining portion.

15. The display substrate according to claim 4, wherein the first metal layer remaining portion, the gate insulation layer remaining portion, the second metal layer remaining portion, the buffer layer remaining portion, the first electrode remaining portion, the passivation layer remaining portion and the second electrode layer remaining portion are sequentially provided in a region where the capacitor is located, a fifth via hole penetrating through the buffer layer remaining portion and the gate insulation layer remaining portion and a sixth via hole penetrating through the passivation layer remaining portion and the buffer layer remaining portion is further provided in the region where the capacitor is located, the first electrode layer remaining portion is electrically connected with the first metal layer remaining portion through the fifth via hole, and the second electrode layer remaining portion is electrically connected with the second metal layer remaining portion through the sixth via hole;

there is an overlapped region between the first metal layer remaining portion, the second metal layer remaining portion, the first electrode layer remaining portion and the second electrode layer remaining portion;

the first electrode comprises the first metal layer remaining portion and the first electrode layer remaining portion, and the second electrode comprises the second metal layer remaining portion and the second electrode layer remaining portion.

16. A display substrate including a display region, a peripheral region, and a capacitor in the peripheral region, wherein:

the capacitor includes a first electrode and a second electrode with an electrical insulation layer provided therebetween, the display region is provided with an insulation layer and conductive layers therein, the first electrode and the second electrode are remaining portions of films formed when making the conductive layers left in the peripheral region, and the electrical insulation layer is a remaining portion of a film formed when making the insulation layer left in the peripheral region, the first electrode comprises a first transparent conductive layer and a first light shielding conductive layer, and the second electrode comprises a second transparent conductive layer and a second light shielding conductive layer.

* * * * *